(12) United States Patent
Magnee et al.

(10) Patent No.: US 8,580,596 B2
(45) Date of Patent: Nov. 12, 2013

(54) FRONT END MICRO CAVITY

(75) Inventors: Petrus H. C. Magnee, Malden (NL); Jan Jacob Koning, Wijchen (NL); Jozef T. M. Van Beek, Rosmalen (NL)

(73) Assignee: NXP, B.V., Eindhoven (NL)

( * ) Notice: Subject to any disclaimer, the term of this patent is extended or adjusted under 35 U.S.C. 154(b) by 288 days.

(21) Appl. No.: 12/421,935

(22) Filed: Apr. 10, 2009

(65) Prior Publication Data
US 2010/0258882 A1 Oct. 14, 2010

(51) Int. Cl.
*H01L 21/00* (2006.01)

(52) U.S. Cl.
USPC ........ 438/50; 438/52; 257/415; 257/E21.705; 257/E29.324

(58) Field of Classification Search
USPC ......... 438/118, 125, 126, 127, 199, 200, 456, 438/459, 50–52; 257/347, 350, 415, 417, 257/E29.324, E21.499, E21.502, E21.705
See application file for complete search history.

(56) References Cited

U.S. PATENT DOCUMENTS

| | | | |
|---|---|---|---|
| 6,294,969 B1 * | 9/2001 | Matsuo et al. ............... | 333/206 |
| 7,008,812 B1 | 3/2006 | Carley | |
| 7,008,855 B2 * | 3/2006 | Baney et al. ............... | 438/406 |
| 7,053,845 B1 * | 5/2006 | Holloway et al. ........... | 343/725 |
| 7,132,753 B1 * | 11/2006 | St. Amand et al. .......... | 257/777 |
| 7,402,897 B2 * | 7/2008 | Leedy ......................... | 257/678 |
| 7,551,058 B1 * | 6/2009 | Johnson et al. ............ | 340/10.41 |
| 7,659,150 B1 * | 2/2010 | Monadgemi et al. ........ | 438/125 |
| 7,825,484 B2 * | 11/2010 | Martin et al. ............... | 257/415 |
| 7,923,790 B1 * | 4/2011 | Quevy et al. ................ | 257/415 |
| 2001/0020878 A1 * | 9/2001 | Speidell et al. ............ | 333/197 |
| 2001/0054937 A1 * | 12/2001 | Hyvonen et al. ............. | 333/32 |
| 2004/0041665 A1 * | 3/2004 | Hode et al. ................. | 333/175 |
| 2004/0043749 A1 * | 3/2004 | Yamawaki et al. .......... | 455/335 |
| 2004/0126953 A1 * | 7/2004 | Cheung ....................... | 438/200 |
| 2005/0058841 A1 * | 3/2005 | Baney et al. ............... | 428/428 |
| 2005/0189621 A1 * | 9/2005 | Cheung ....................... | 257/619 |
| 2006/0077531 A1 * | 4/2006 | Novotny et al. ............. | 359/291 |
| 2006/0135195 A1 * | 6/2006 | Leinonen et al. .......... | 455/550.1 |
| 2006/0144142 A1 * | 7/2006 | Gogoi ......................... | 73/504.02 |

(Continued)

FOREIGN PATENT DOCUMENTS

EP 2236456 A1 * 10/2010
WO 20041071943 A3 8/2004

(Continued)

OTHER PUBLICATIONS tMt, "Wafer Thinning Technology," http://www.tmt-mems.com/wafer_thinning.html, pp. 1-2, Dec. 5, 2008.*

(Continued)

*Primary Examiner* — James Mitchell
*Assistant Examiner* — Joseph C Nicely

(57) ABSTRACT

The present invention relates to a method of forming a micro cavity having a micro electrical mechanical system (MEMS) in a process, such as a CMOS process. MEMS resonators are being intensively studied in many research groups and some first products have recently been released. This type of device offers a high Q-factor, small size, high level of integration and potentially low cost. These devices are expected to replace bulky quartz crystals in high-precision oscillators and may also be used as RF filters. The oscillators can be used in time-keeping and frequency reference applications such as RF modules in mobile phones, devices containing blue-tooth modules and other digital and telecommunication devices.

19 Claims, 7 Drawing Sheets

(56) References Cited

U.S. PATENT DOCUMENTS

Figure 1:
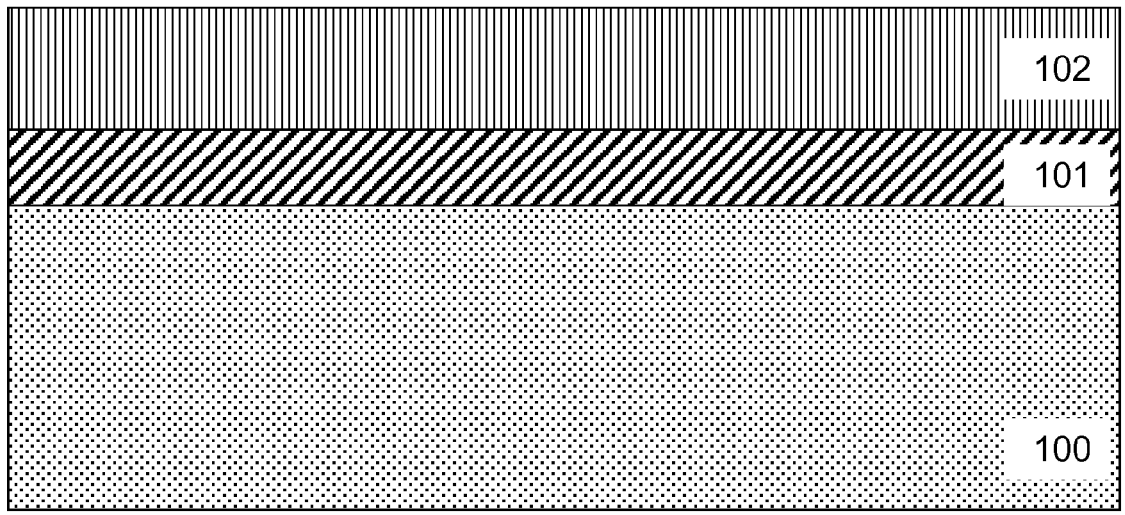

| | | |
|---|---|---|
| 2006/0148133 A1 | 7/2006 | Nunan et al. |
| 2006/0208823 A1* | 9/2006 | Hunt et al. ............... 333/24 C |
| 2006/0219020 A1* | 10/2006 | Silverbrook et al. ....... 73/729.2 |
| 2007/0040268 A1* | 2/2007 | Sherrer et al. ............. 257/712 |
| 2007/0082622 A1* | 4/2007 | Leinonen et al. ............ 455/78 |
| 2007/0111365 A1 | 5/2007 | Tateishi et al. |
| 2007/0164419 A1* | 7/2007 | Sherrer et al. ............. 257/689 |
| 2007/0190680 A1* | 8/2007 | Fukuda et al. ............. 438/50 |
| 2007/0241415 A1* | 10/2007 | Ko et al. .................... 257/415 |
| 2007/0281381 A1 | 12/2007 | Ayazi |
| 2007/0284682 A1* | 12/2007 | Laming et al. ............. 257/416 |
| 2008/0038868 A1* | 2/2008 | Leib ........................... 438/107 |
| 2008/0054759 A1* | 3/2008 | Ayazi et al. ............... 310/309 |
| 2008/0131662 A1* | 6/2008 | Jordan et al. .............. 428/141 |
| 2008/0224792 A1* | 9/2008 | Nielsen ...................... 333/17.1 |
| 2009/0004818 A1* | 1/2009 | Shin et al. .................. 438/435 |
| 2009/0050988 A1 | 2/2009 | Suzuki et al. |
| 2009/0081828 A1* | 3/2009 | Freidhoff et al. ........... 438/113 |
| 2009/0160040 A1* | 6/2009 | Nabki et al. ................ 257/678 |
| 2009/0169035 A1* | 7/2009 | Rombach et al. ........... 381/175 |
| 2009/0211885 A1* | 8/2009 | Steeneken et al. ........... 200/181 |
| 2009/0212407 A1* | 8/2009 | Foster et al. ............... 257/686 |
| 2009/0237179 A1* | 9/2009 | Chen ........................... 333/186 |
| 2009/0243004 A1* | 10/2009 | Lan et al. .................... 257/415 |
| 2010/0019872 A1* | 1/2010 | Bozler et al. ............... 333/248 |
| 2010/0044808 A1* | 2/2010 | Dekker et al. .............. 257/415 |
| 2010/0117767 A1* | 5/2010 | Liu ............................. 333/204 |
| 2010/0187669 A1* | 7/2010 | Leib ............................ 257/684 |
| 2010/0210073 A1* | 8/2010 | Witvrouw et al. .......... 438/124 |
| 2010/0279451 A1* | 11/2010 | Nabki et al. .................. 438/51 |
| 2010/0289097 A1* | 11/2010 | Weigold et al. ............. 257/416 |
| 2010/0307786 A1* | 12/2010 | Kohl et al. .................. 174/50.51 |
| 2010/0314668 A1* | 12/2010 | Ollier et al. ................. 257/252 |
| 2011/0027930 A1* | 2/2011 | El-Gamal et al. ............ 438/51 |
| 2011/0103622 A1* | 5/2011 | Weigold ...................... 381/174 |
| 2011/0111545 A1* | 5/2011 | El-Gamal ...................... 438/50 |
| 2011/0121416 A1* | 5/2011 | Quevy et al. ................ 257/417 |
| 2011/0212563 A1* | 9/2011 | Martin et al. ................. 438/51 |
| 2013/0143347 A1* | 6/2013 | Morris, III et al. ........... 438/50 |

FOREIGN PATENT DOCUMENTS

| | | | |
|---|---|---|---|
| WO | WO 2007004119 A2 * | 1/2007 | .............. B81B 3/00 |
| WO | WO 2008044182 A2 * | 4/2008 | .............. H03H 9/24 |
| WO | 2008067294 A2 | 6/2008 | |
| WO | 2007004119 | 1/2009 | |
| WO | 2009133506 | 11/2009 | |

OTHER PUBLICATIONS

European Search Report, 09156730.5, Sep. 19, 2009.

* cited by examiner

FRONT END MICRO CAVITY

The present invention relates to a method of forming a micro cavity, preferably comprising a micro electrical mechanical system (MEMS), in a process, such as a CMOS process.

MEMS resonators are being intensively studied in many research groups and some first products have recently been released. This type of device offers a high Q-factor, small size, high level of integration and potentially low cost. These devices are expected to replace bulky quartz crystals in high-precision oscillators and may also be used as RF filters. The oscillators can be used in time-keeping and frequency reference applications such as RF modules in mobile phones, devices containing blue-tooth modules and other digital and telecommunication devices.

Microelectromechanical systems (MEMS) are the technology of the very small, and merge at the nano-scale into nano-electromechanical systems (NEMS) and nanotechnology. MEMS are also referred to as micromachines (in Japan), or Micro Systems Technology—MST (in Europe). MEMS are separate and distinct from the hypothetical vision of Molecular nanotechnology or Molecular Electronics. NEMS are made up of components between 1 to 100 μm in size (i.e. 0.001 to 0.1 mm) and MEMS devices generally range in size from a 20 μm to a millimeter. Further, they usually consist of a central unit that processes data, a microprocessor, and several components that interact with the outside, such as microsensors. At these size scales, the standard constructs of classical physics do not always hold true. Due to MEMS' large surface area to volume ratio, surface effects such as electrostatics and wetting dominate volume effects such as inertia or thermal mass.

A MEMS device can be protected for dicing and molding by a wafer level encapsulating process.

Because MEMS devices are fragile, e.g., due to moving parts typically being present, and the device performance is affected by impurities (e.g. particles), they have to be protected during wafer dicing and bonding. Some MEMS structures (e.g. MEMS resonators) need to be hermetically sealed from the environment since gas pressure has a direct influence on the properties of the MEMS device. Other MEMS structures (e.g. MEMS switches) need a well-controlled gas environment in order to function optimally. An integrated wafer level encapsulating process can achieve this protection. This implies that a MEMS structure is built inside a cavity with an encapsulation shell by using state of the art processing steps.

Various documents describe the manufacture of MEMS devices.

U.S. Pat. Publ. US2007/0281381 A1 describes a method to fabricate a MEMS device by backside-releasing the MEMS structure once the CMOS processing is finished, without damaging the CMOS circuit. The device may be capped by poly silicon. The silicon dioxide of an SOI wafer may be used as an etch stop when etching through the backside. The structure is subsequently released by etching the silicon dioxide enclosing the device.

While it is claimed that the MEMS could be fabricated prior to, between, or after the CMOS fabrication steps, CMOS fabrication steps are not used for fabricating the MEMS. Even further, no details of such fabrication are given, at all, let alone of order of processing.

Further, as a drawback of the above method, the release opening at the back side is a relatively large opening, and can therefore not be closed by a simple deposition technique, at least not without jeopardizing the integrity and performance of the MEMS. Therefore such an opening needs to be closed by wafer bonding. Such an approach is costly, comes with a risk of damaging or polluting the MEMS and is relatively cumbersome.

U.S. Pat. Publ. US2008/0054759 A1 relates to a MEMS device fabricated on the same wafer as a CMOS circuit. The structures disclosed, e.g., those of FIGS. 3a-d, involve many extra processing steps in order to produce the device as well as the circuit, such as for forming electrodes and capping material. These processing steps are typically not available in standard CMOS processes.

Further it is noted that the MEMS is typically processed separately, such as in FIGS. 9a-f, with only the substrate being the same. Such integration is costly. Also, an early release of a MEMS structure, as is the case, results in yield losses, for example, due to mechanical and thermal stress, and vibrations, during subsequent processing.

PCT Pat. Publ. WO2008/067294 A1 relates to the formation of microstructures using CMOS processes. A typical MEMS structure is shown in FIGS. 2a-e. The MEMS structure (290) comprises a stack of material (212, 240), wherein the thickness of layers (240) is determined by a DRIE etch step without having a clear stop layer. As a consequence, the mass of the structure is not controlled, at least not well controlled, which is not ideal for a resonator, and may lead to a malfunctioning device.

Further, in order to encapsulate the structure, two wafer bonding steps need to be applied, both from a front side and a back side. Such is costly and time consuming.

The above-described solutions result in thick layers; hence, large topography is introduced, which makes integration with standard processes very difficult. Further, space-demanding structures, such as capping at the end of a process, are provided, requiring additional space around the micro cavity typically comprising a device. Typically, additional processing is required, which further creates extra topography. Such topography is undesirable for various reasons, such as subsequent patterning, sealing, etc. Further, currently only a few companies are capable of integrating Micro Electrical-Mechanical Systems (MEMS) with a standard process, such as a CMOS process.

An embodiment according to the present invention relates to a method of forming a micro cavity, including a micro electrical mechanical system (MEMS), in a process that involves forming at least one semiconductor component in parallel with the micro cavity and having process steps in common, such as a CMOS process, and then releasing the micro cavity after the formation of the at least one semiconductor component is finished. Other embodiments relate to a micro cavity having a MEMS structure with release openings through a substrate on which the micro cavity is formed, a device having a micro cavity with release openings, and an RF circuit having a micro cavity with release openings.

The present method provides for devices, such as accelerometers and various MEMS, that can be packaged, that are damped by high pressure, and that do not need any getter. It is noted that embodiments having a cap wafer on a thick MEMS might comprise a getter in the case of a gyroscope (see, for example, FIG. 14).

The present method further provides a synergy with a CMOS process, in terms of common (MEMS and CMOS) used poly or metal, saving mask steps, cost, and processing time.

As such, a method is provided that is capable of integrating a micro cavity with a standard process. Examples of such processes are Silicon-on-Insulator (SOI) processes, which are not only very well suited for making thin-SOI micro cavity devices, but can also be combined with high-voltage electronics. One of the main components that is developed in the method of the present invention is a cavity that is:

1) Hermetically sealed: e.g. vacuum; and
2) Small, for example, wafer-level chip-scale package (WL-CSP); and
3) Strong: a cavity should not collapse due to the molding pressure with plastic packages.

The present invention results in relatively thin layers and space-saving structures, such as caps. Further, the resulting micro cavity, such as a Micro Electrical-Mechanical System (MEMS), is fully integrated with a standard process, such as a CMOS process. This provides advantages, in terms of costs, reliability, and manufacturability.

Figure 2:
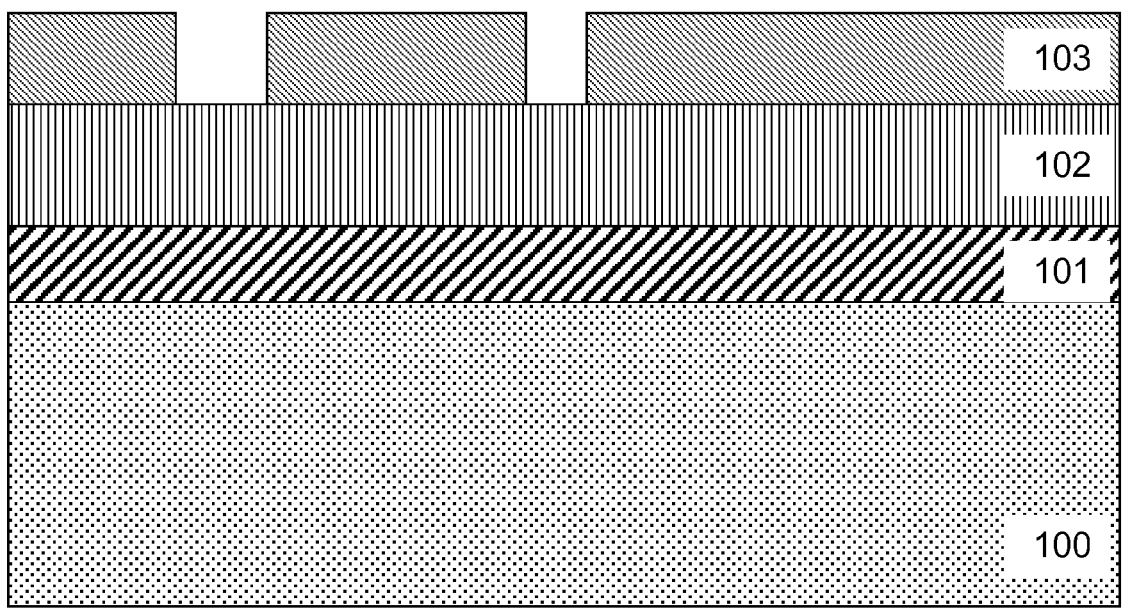
Figure 3:
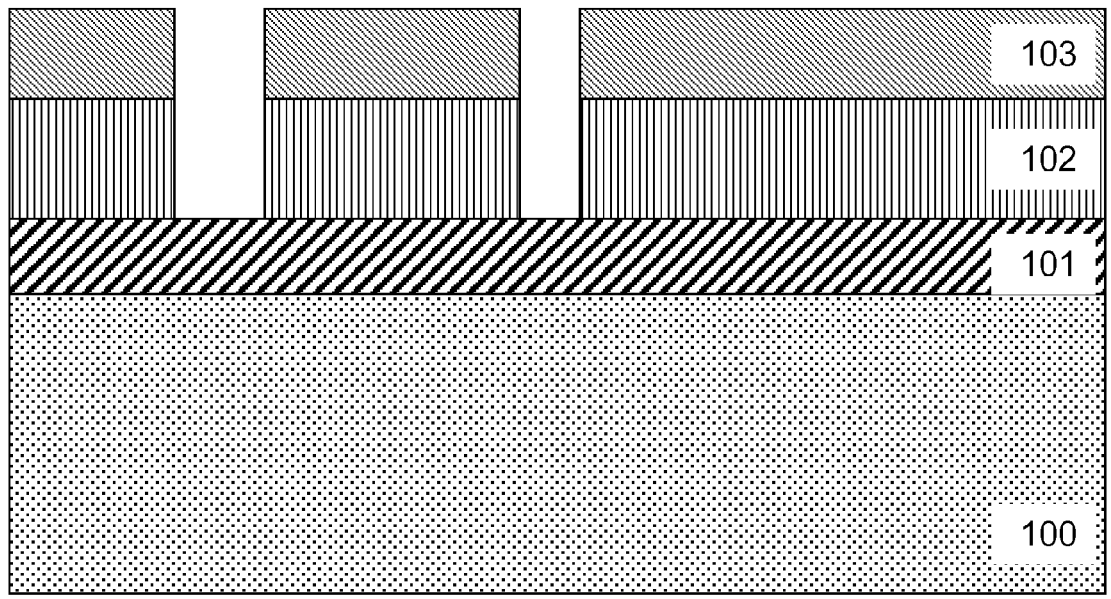
Figure 4:
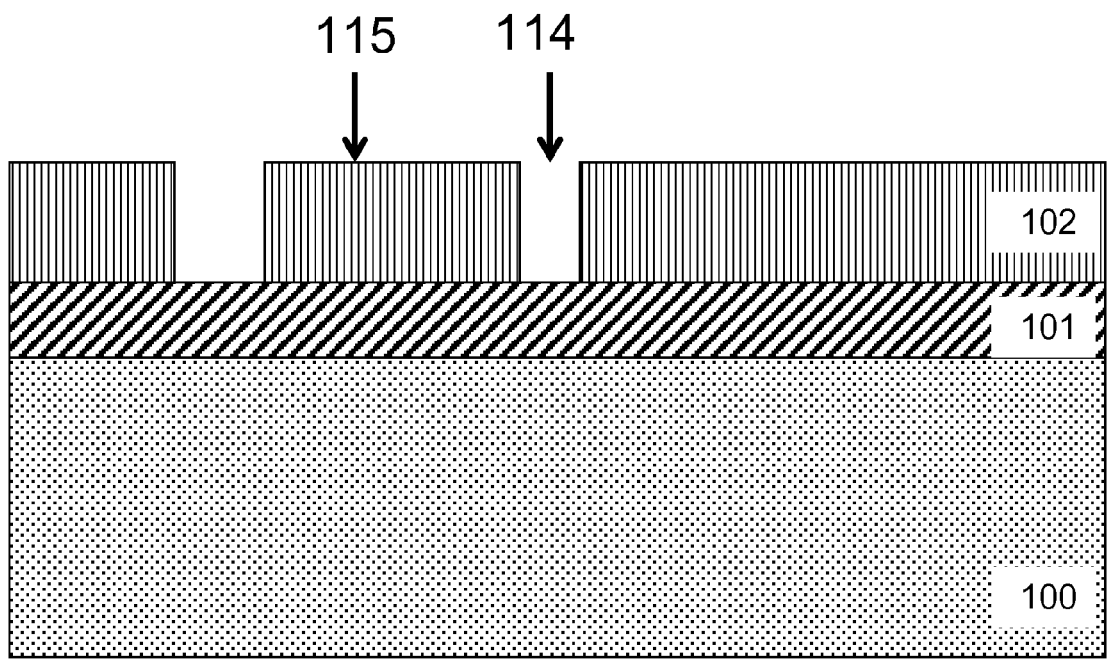
Figure 5:
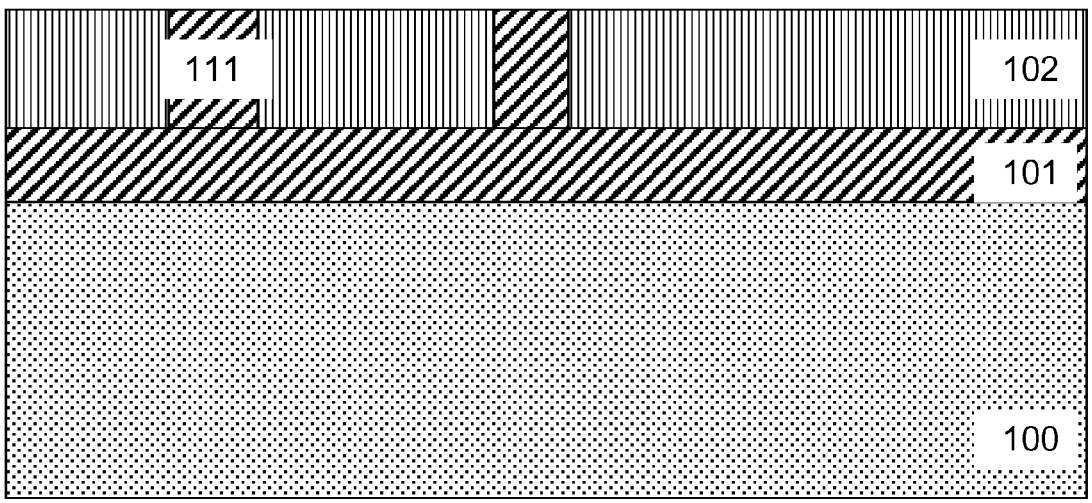
Figure 6:
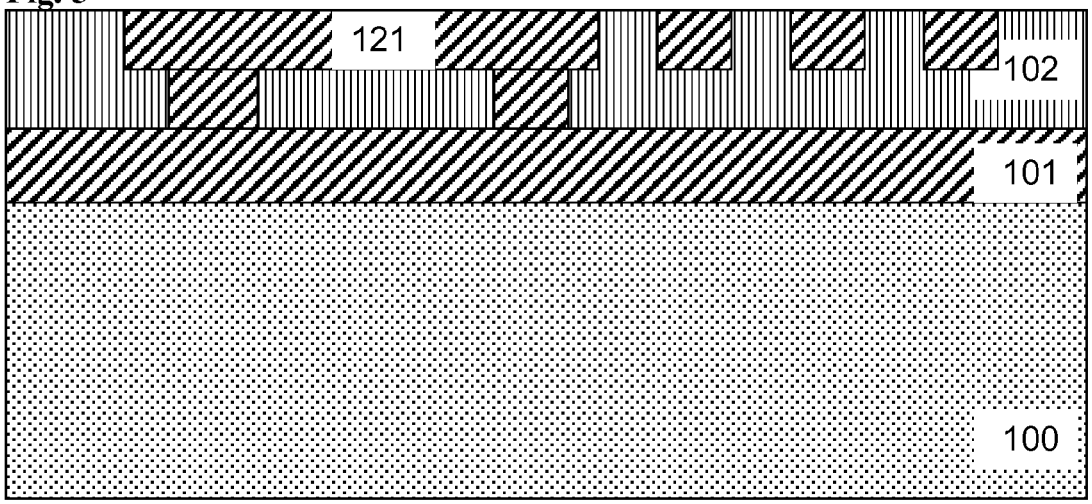
Figure 8:
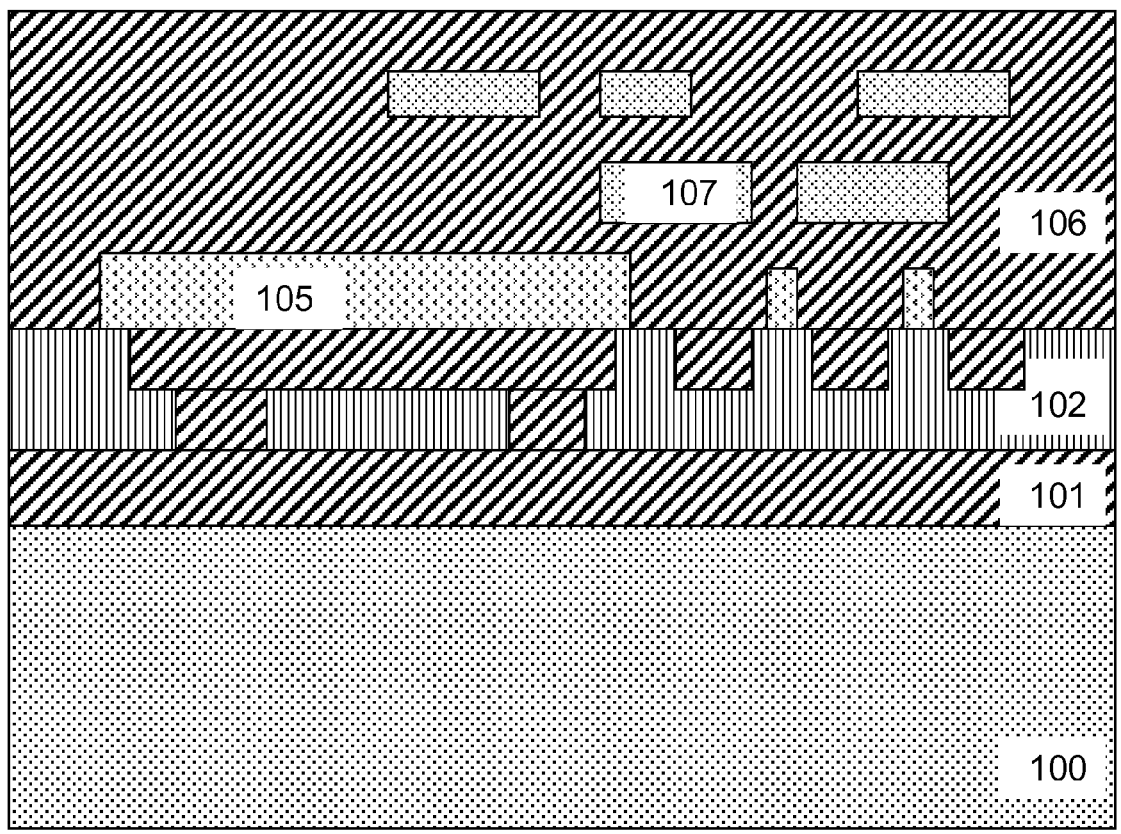
Figure 9:
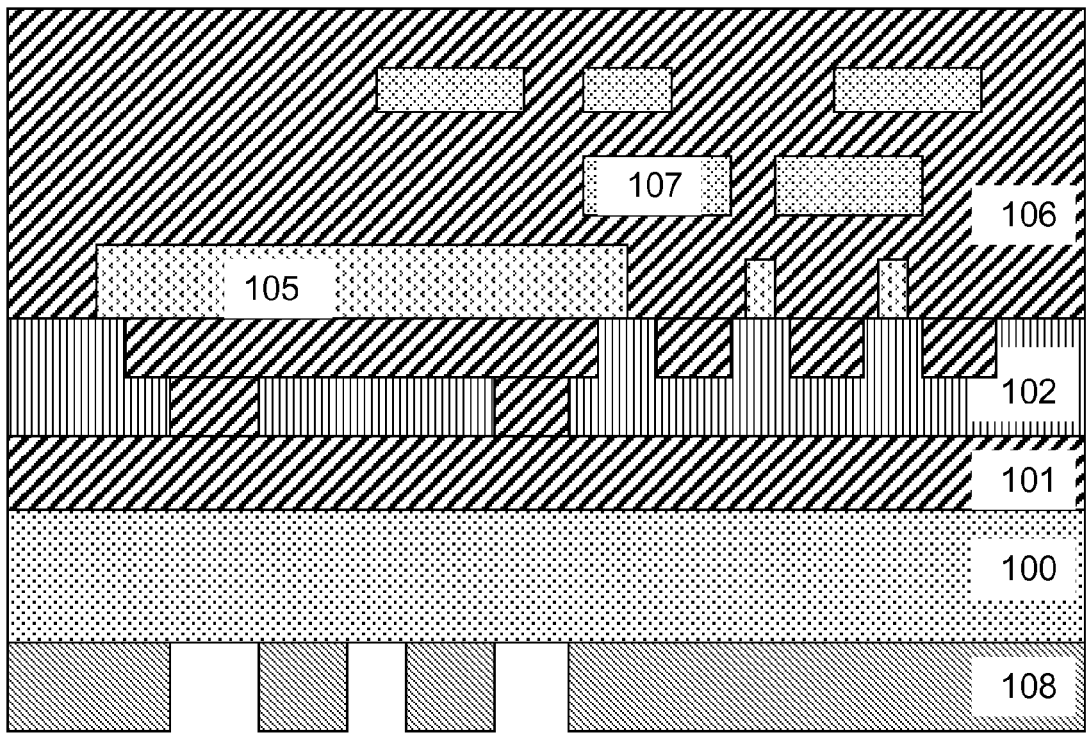
Figure 10:
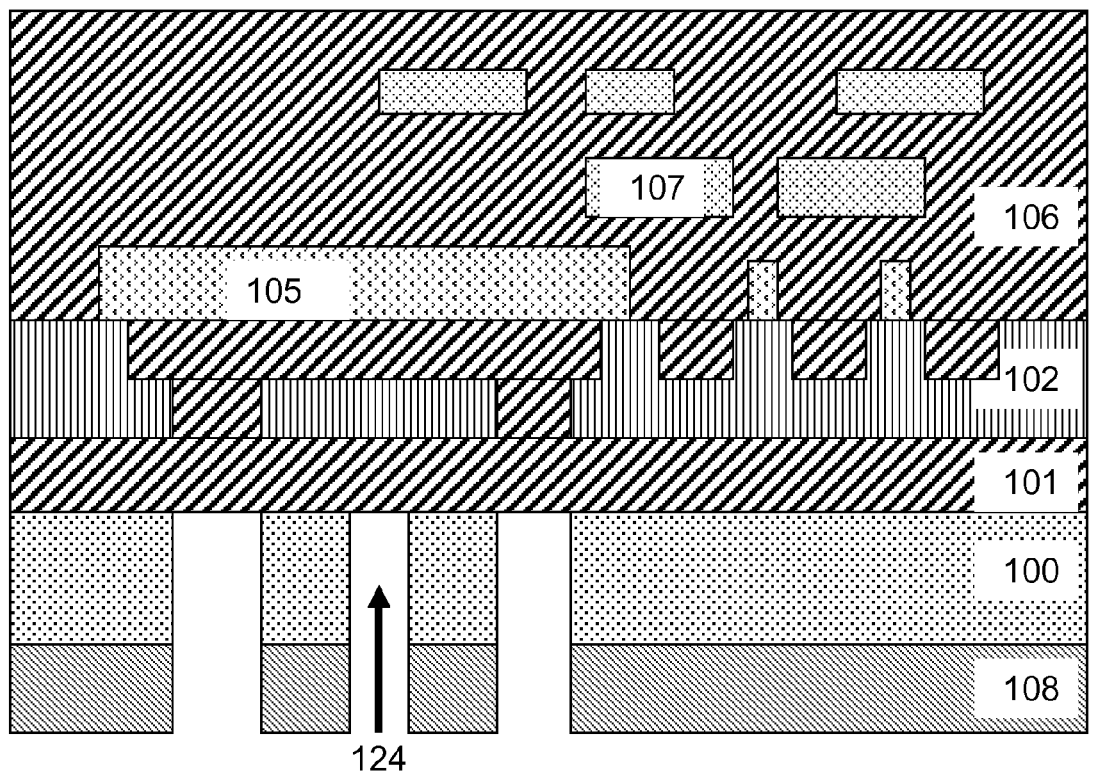
Figure 11:
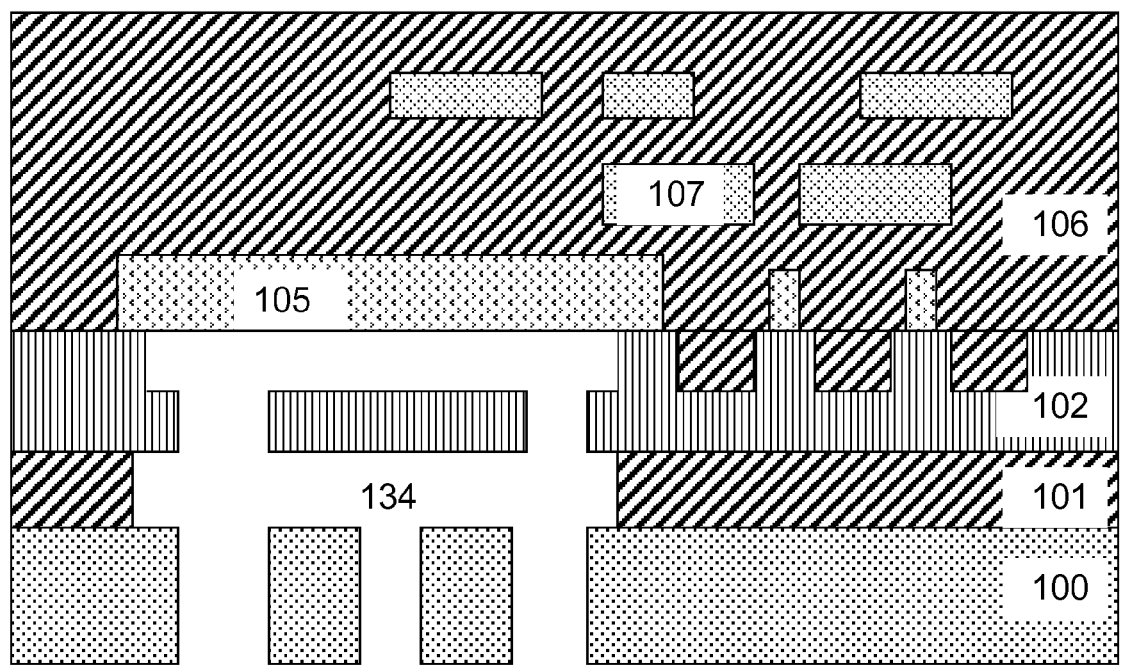
Figure 12:
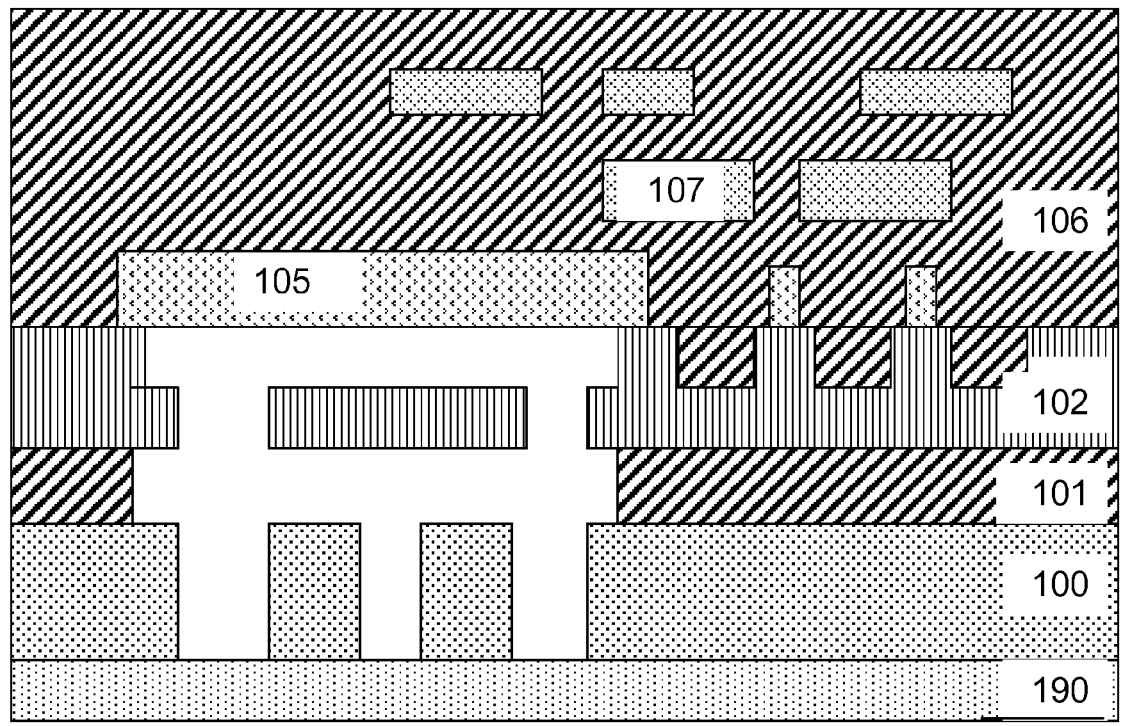
Figure 13:
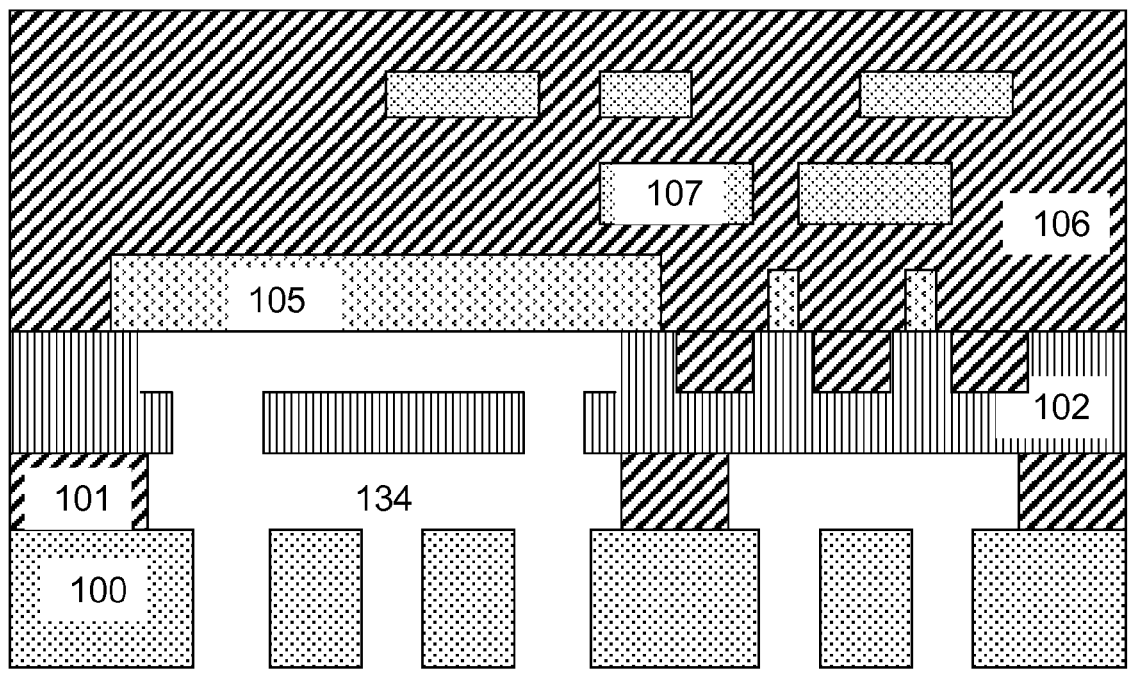
Figure 14:
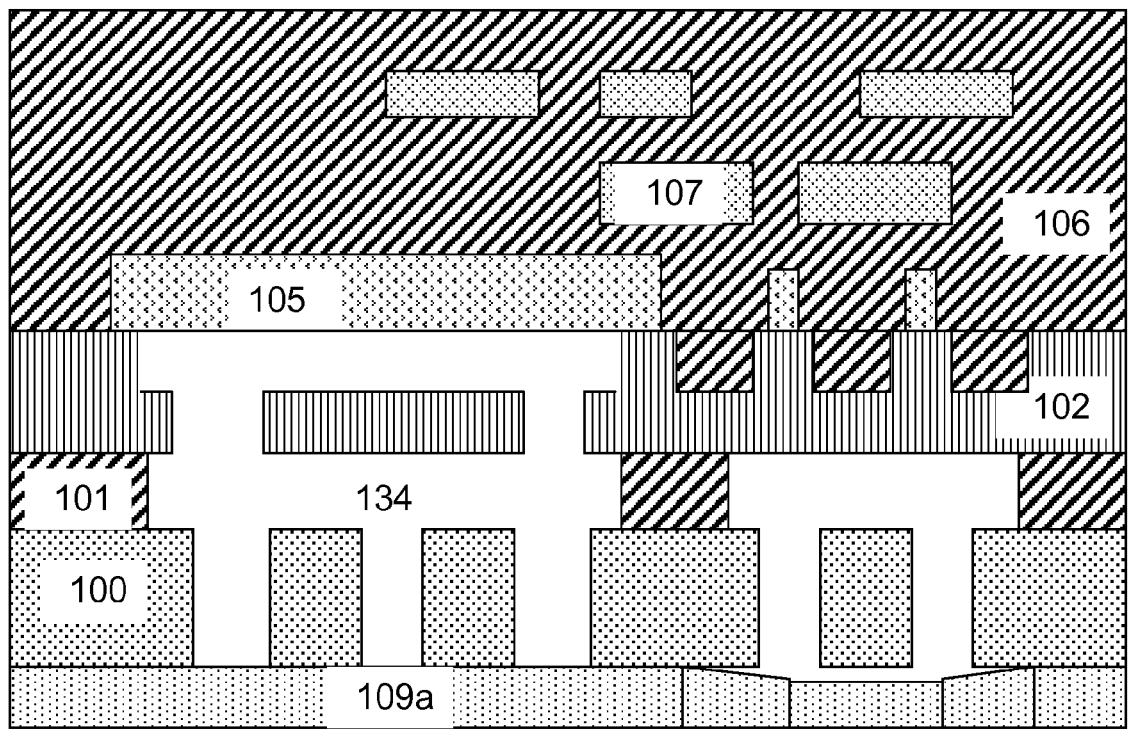

FIG. 1 shows a starting material.
FIGS. 2-4 show first steps to define a MEMS structure.
FIG. 5 shows further processing.
FIGS. 6-7 show a top surface of the MEMS to be separated.
FIG. 8 shows a remainder of CMOS processing.
FIG. 9 shows grinding of silicon substrate.
FIG. 10 shows etching of trenches.
FIG. 11 shows release of the MEMS device.
FIG. 12 shows sealing of the MEMS device.
FIG. 13 shows release of a first and second MEMS device.
FIG. 14 shows sealing of a first and second MEMS device.

In a first aspect, the present invention relates to a method of forming a micro cavity that includes a micro electrical mechanical system (MEMS), in a process that involves forming at least one semiconductor component in parallel with the micro cavity and having process steps in common, such as a CMOS process. The micro cavity can be capped with a poly silicon layer, such as a poly silicon gate layer. The micro cavity is released after the formation of the at least one semiconductor component is finished.

The micro cavity can be any cavity with predetermined dimensions on the order of micrometers or nanometers. Typically removing a predetermined part of material being present, such as by etching, forms the micro cavity.

It is noted that contrary to what is know in the prior art, a micro cavity and at least one semiconductor component are truly manufactured within one process flow, having process steps in common.

Further, release openings are relatively small openings, and can therefore be closed by a simple deposition technique, without jeopardizing the integrity or performance of the MEMS. In an embodiment, a thick MEMS, e.g. larger than >10 μm or >100 μm, and a thin MEMS, typically a few μm, one having a high frequency, such as >1 MHz or >10 MHz or even 1>GHz, and one having a low frequency such as <1 MHz, though typically above a few times 10 kHz, are formed on the same substrate.

In a preferred embodiment, the present invention further differs from the method described in U.S. Pat. Publ. US2007/0281381 A1 in that the backside is sealed using a sputtered metal layer instead of a bonded wafer.

In a preferred embodiment, the present invention further differs from the method described in U.S. Pat. Publ. US2007/0281381 A1 in that the present invention explicitly uses a poly silicon gate layer of a CMOS process as a cap for the MEMS cavity, as opposed to a more general etch resistant poly silicon cap.

In a preferred embodiment the present invention relates to a micro cavity comprising a MEMS.

Advantageously, the process of forming a semiconductor component is a well-known process, such as a CMOS process. Even more preferred is the so-called ABCD process. An important aspect of the present invention is that the micro cavity is released after the process for forming the semiconductor device is finished. For example, releasing the micro cavity results in a micro cavity that includes a material, which material is removed, as such leaving a micro cavity behind. The process can be adapted to form any shape, size, complex, etc. of micro cavity. Thus, the present invention allows for a significant degree of freedom in designing a micro cavity.

Another advantage is that various process steps can be used in common to form a MEMS structure and a semiconductor component. As such one or more of a substrate, a silicon oxide such as a BOX layer, a mono crystalline silicon layer, etching of trenches, forming silicon oxide, as in STI or LOCOS, deposition of one or more metal layers, one or more patterning steps, deposition of poly silicon, a second etch, one or more inter metal dielectric layers, and grinding of substrate, process steps can be used in common.

In an embodiment, the micro cavity is capped with a poly silicon layer, such as a poly silicon gate layer. Such a poly silicon layer may be used in a CMOS process for other purposes, e.g. for defining a poly silicon layer of the at least one semiconductor component. In another embodiment, the poly silicon layer is used for defining a gate layer. As such, this embodiment further reduces necessary mask steps for forming the micro cavity by at least one, as a mask for defining a poly gate may also be used for defining the cap of the micro cavity. A further advantage is that no separate sealing step is needed, as the present cap functions as such. Such a cap is provided as a layer covering the micro cavity to be formed.

The present invention provides at least the following advantages.

Dimensions of a MEMS device can be defined early on in the process, allowing certain regions such as leads, but also the MEMS itself, to be properly doped to make good contacts. This can be done using the existing implantation and diffusion steps of standard CMOS processing.

A MEMS device according to the invention is encapsulated with a rigid material, contrary to a process with a release thereof, which means that no special care is required for wafer handling during processing.

The cavity may still require extra material for strength, but this can be added completely at the end of the process using a thicker passivation stack, without incurring additional topography.

In case the MEMS is combined with a SOI process, for the MEMS definition (trenches) it is, in principle, possible to use a trench-isolation mask (MTI) already present in the SOI process.

A front-end MEMS capping typically consists of default layers used: a gate-poly silicon layer or first metal interconnect layer being the most likely one. Hence, no additional topography at all results from the MEMS with respect to the CMOS.

In case the MEMS cap includes a conductive layer (e.g. gate-poly or metal interconnect, being an alternative) it may also be connected electrically to form an electrode out of plane. This would enable, for instance, a sensor that is not only sensitive to in-plane motion, but fully in 3D. A full 3D sensor usually requires at least two devices. Such a 3D sensor is also envisaged.

The capping layer can also be used as the sole electrode, for a 1D out of plane sensor, for instance in a pressure sensor.

Relative to what is known in the prior art, due to sealing the backside not with a second wafer (wafer-to-wafer bonding), but with a metal deposition, the total die thickness can be kept very low. This has significant benefits specifically where thin devices are required for smart-card applications. The present invention thus also relates to such a thin device.

Monolithic integration of the MEMS with CMOS for the electronics (biasing, actuation, read-out, etc.) will generally improve (e.g., reduce) power consumption and increase sensitivity/resolution, since there is no loss of data and/or power due to interconnection between two separate dies. The present invention thus also relates to such integration.

In an embodiment, a method involves providing a substrate, such as a silicon substrate, having a front side comprising the at least one semiconductor component and a back side, providing a first set of one or more release openings through the backside of the substrate, selected from the group consisting of a trench, a via, a hole, and combinations thereof, and etching through the one or more release openings, thereby releasing the micro cavity.

In an embodiment, the at least one semiconductor component is provided at a first side, e.g., the front side, whereas the micro cavity is released at the other side, e.g. the backside, or vice versa. Thereto the other side, e.g., the backside, needs to be provided with one or more release openings, in order to etch through the substrate and remove material inside the micro cavity.

In an embodiment, a structure, in a further process step forming the micro cavity having a MEMS, is thus already formed, in parallel with the formation of the at least one semiconductor component.

As most of the present processes comprise a silicon substrate, such a substrate is preferred in terms of processability.

The one or more release openings may be selected from the group consisting of a trench, a via, a hole, and combinations thereof. The total area of the release openings is preferably large enough to allow easy access of an etch material towards the micro cavity to be released and to allow a relatively short processing time. Preferably the total area of the openings is from 0.3%-50% of the surface available, preferably from 5-40% of the surface, such as from 10-25%. For example, holes having a size of 0.6 µm×0.6 µm and a pitch of 9 µm could be used. The density of the openings is typically from 0.01-0.25 per µm$^2$, such as from 0.05-0.1 per µm$^2$. In an embodiment, the release openings are situated below the MEMS structure, thereby saving space. The area of one release opening is preferably large enough to allow easy access of etch chemical.

In an embodiment, a method involves depositing a hermitic sealing layer, such as a metal layer, on the backside of the substrate to seal the micro cavity formed by etching, preferably comprising a MEMS device, such as by sputter-deposited aluminum.

In an embodiment, the micro cavity is hermitically sealed in order to minimize environmental influences and in order to optimize the functioning of the micro cavity. In an embodiment, the micro cavity comprises a MEMS.

In an embodiment, the sealing layer is a metal layer or a dielectric layer, such as an oxide or a silicon nitride, though preferably a metal layer. In an embodiment, the metal layer is deposited by sputtering. In an embodiment, the metal layer is an aluminum layer. Aluminum deposition, by means of sputtering is done at very low pressure (µbar range). This pressure is then "captured" in the cavity, which is preferred for those MEMS applications that require vacuum (e.g. MEMS resonator, gyroscope). Furthermore, aluminum is also completely hermetic. Dielectric layers, such as PECVD silicon-oxide or -nitride are deposited at pressures significantly higher than aluminum (albeit still reduced pressure, mbar range). These layers also still suffer from out-gassing, increasing the pressure in the sealed cavity even further.

In an embodiment of a method, the micro cavity comprises a MEMS, and the micro cavity prior to etching comprises a dielectric material, such as an oxide. The method involves depositing a dielectric layer on the front side of the substrate, such as a BOX layer, depositing a silicon layer on the dielectric layer, forming a second set of one or more release openings in the silicon layer, selected from the group consisting of a trench, a via, a hole, and combinations thereof, forming a dielectric structure in the silicon layer and filling the second set of one or more release openings with a dielectric material, and etching the first set of one or more release openings through the back side of the substrate, below the MEMS device, all the way up and through to the dielectric layer, removing the dielectric material in the second set of one or more release openings in the silicon layer, and removing the dielectric structure in the silicon layer, thereby releasing the MEMS, wherein the etching is preferably chosen from wet- or vapor-HF etch.

In an embodiment, a dielectric layer is deposited on the front side of the substrate, such as a BOX layer. The BOX-layer (Buried Oxide) can also be used as a stopping layer for the etch of the back-side release holes. As an alternative, SmartCut wafers could be used, having a layer with oxide, which oxide is possibly oxidized, rather then deposited, after which two wafers having an oxide layer are bonded on each other. One of these two wafers may have had a hydrogen implant, which will cause a layer to detach under pressure, temperature rise, etc. A SOI substrate is provided as such.

Further preferred is the deposition of a silicon layer on the dielectric layer, thereby forming a SOI structure. The thickness of the silicon layer in SOI, and hence the mass of the MEMS device, is much better controlled compared to a timed etch, leaving a silicon membrane after back-side etch.

Even further preferred is the forming of a second set of one or more release openings in the silicon layer, selected from the group consisting of a trench, a via, a hole, and combinations thereof. Such a second set of openings preferably has similar characteristic as to those described above for the first set of openings.

In an embodiment, a dielectric structure in the silicon layer is formed and the second set of one or more release openings is filled with a dielectric material, thereby allowing removal of the dielectric in a further processing step, forming the micro cavity or part thereof.

In principle, the dielectric materials used in various process steps may be the same or different. It is important that relative etch properties, e.g., with respect to surrounding material, can be optimized in order to allow for a large freedom of design of the micro cavity. The dielectric material may be silicon oxide, a buried oxide, a LOCOS, etc. or a dielectric material offering further advantages and/or characteristics, such as high-K dielectrics.

By etching the first set of one or more release openings through the back side of the substrate, below the MEMS device, all the way up and through to the dielectric layer, thereby removing the dielectric material in the second set of one or more release openings in the silicon layer, and removing the dielectric structure in the silicon layer, the MEMS is released.

In an embodiment, the etching is chosen from wet- or vapor-HF etch. HF (wet or vapor) is very selective towards silicon, it substantially only etches silicon-oxide. Vapor HF is preferred because it does not require drying after the etch, which could cause stiction of the MEMS device to a cavity wall.

In an embodiment, before etching, the back side of the substrate is grinded down to a pre-determined thickness at the back side thereof, such as to a thickness of 50-400 µm, preferably to a thickness of 100 µm.

In order to reduce etch time, the substrate may be grinded down to a thickness that is as small as possible. However, in terms of strength, the substrate should not be too thin.

In an embodiment, a method involves providing a substrate, wherein a starting material is a standard thin-film SOI substrate, consisting of a mono-crystalline silicon substrate, a buried silicon oxide layer (BOX), typically of 0.2-10 µm thickness, such as 1 µm thickness, and a thin mono-crystalline silicon layer of 0.2-10 µm thickness, such as 1.5 µm thickness, defining a micro cavity, such as comprising a MEMS structure, such as by forming the second set of one or more release openings in the silicon layer, and by forming a dielectric structure in the silicon layer by etching and filling the etched portions that later on in the process will be released, wherein one or more release openings in the silicon layer are etched down to the BOX, thereby completely isolating the MEMS structure, except for some anchor points, which anchor points form part of a MEMS structure and connect the MEMS to the surrounding environment, wherein in some cases, this step is combined with an available isolation step for the one or more release openings, such as a trench isolation step, filling the one or more release openings with silicon oxide, separating a top surface of the MEMS, such as by using the standard field isolation, such as STI or LOCOS, followed by covering the entire MEMS structure with, in an example, the poly silicon layer of a CMOS gate, wherein an overlap of a capping layer (poly silicon) and oxide (STI or LOCOS) beyond the edge of the MEMS structure is defined such that during a subsequent release etch there is some oxide remaining to the sides, and in the same steps also a normal field isolation and gate patterning are provided.

An advantage of the present invention is that a SOI substrate can be used.

In an embodiment, a method involves forming a separation layer, wherein a first inter-metal dielectric (IMD) layer or LOCOS or STI is used as a separation layer, and/or wherein METAL1 or gate-poly silicon is used as a cap-layer.

An advantage is that no additional processing is required and no extra topography is present due to additional layers. Furthermore, since these layers consist of the standard CMOS layers, they can be electrically connected in a default way.

In a second aspect, a micro cavity, such as a MEMS structure, includes release openings through a substrate on which the micro cavity is formed. Typically such a micro cavity is provided by the present method.

In an embodiment, a micro cavity further includes at least one semiconductor component on a first side of the substrate and a hermitic sealing layer on a second side of the substrate.

Such a micro cavity provides the same advantages as the present method.

In an embodiment, a combination of at least one thick MEMS and at least one thin MEMS are formed in the same substrate. For example, both a thick resonator for low frequencies and a thin resonator for high frequencies are integrated.

An interesting and unique application is a combination of two MEMS oscillators in one clock chip. For instance, on the one hand, one 32 kHz (to be more precise: $2^{15}$ Hz) clock is present in many applications, like for a low power standby option, which could have a limited absolute frequency accuracy, and on the other hand, further clocks or timing devices are used, which require a much higher frequency (several MHz to for instance 48 MHz) and a much better precision of the frequency as well.

For a high frequency clock system, for instance USB2, a device at a fixed frequency of 6 MHz or higher, up to 48 MHz, is commonly used. Such high frequency oscillator applications can be critical for jitter when used with, for example, audio players, processor clocks, digital video systems, other digital signal processors, or USB2, USB3.

As such, a low frequency resonator is made in the same die as a high frequency resonator. The processing flow is very suitable to integrate these resonators with a (Bi)CMOS circuit.

The general problem for integrating a MEMS resonator for a low frequency (LF) clock with a thin MEMS resonator for high frequencies (HF) is that the two devices ideally require different device thicknesses. The present solution provides a technology with two layer thicknesses. These are the thin SOI layer and the thick handle wafer substrate.

For HF resonators the inventors observe the following.

For HF frequencies oscillators, a well defined resonator device thickness of between 1 to 2 µm is convenient. In some embodiments, 1.5 µm thick SOI is used. An advantage of these small device thicknesses are that well-dopes can be implemented, and etching of the device trenches and release holes can be compatible with standard CMOS manufacturing.

The use of very fine lithography (Deep UV steppers capable of 0.2 µm gaps with accuracy of +/−10 nm is standardly available in many 8" fabs) can produce a process spread of less than 500 ppm, which allows for clocks for USB2 standard (+/−300 ppm absolute frequency accuracy). Together with standard CMOS trench etch techniques, a very good accuracy better than +/−20 nm is achievable, without more complicated Deep Reactive Ion Etching technology.

An advantage of using e.g. SmartCut SOI is a very good layer thickness definition, which gives amongst other things a more precisely reproducible resonant frequency of the device. For higher frequencies, a higher precision is typically required as the wavelength of a standing wave in a resonator will be shorter for those high frequencies. For instance, device dimensions are about 160 µm for a ground tone of 26 MHz in a bulk mode resonator. The higher the frequency, typically the better the required geometrical definition of the resonator. This precision and the use of those standard IC production techniques are a decisive advantage for HF resonators to have a thin layer thickness for a MEMS device ("surface micro machining").

Piezo-resistive readout devices also benefit from an ability to optimize dopes in silicon for optimization of the devices, as a thin device layer is suitable to ion implantation and well diffusion. Even capacitive devices benefit from having optimized dopes for electrodes to minimize parasitic resistances by implanted dopes.

For achieving a good Q-factor (e.g. >10000) with low enough damping, a vacuum should be less than 1 mbar for many HF resonators.

For LF resonators, the following is observed:

As a resonant frequency $F_{res}=\frac{1}{2}\pi\ast\sqrt{(k/m)}$, a resonator device with a small mass m ($1\ast10^{-10}$ kg) requires a very low spring constant k of about 1 for a LF resonator. If a layer is thin (between 1 and 2 µm), the mass of a resonator can be increased, but this would also result in a larger surface area. This makes production very difficult as a large area combined with a low spring constant is very vulnerable to capillary forces, with stiction as a major problem. Therefore a device thickness that is a few or 10 or more times thicker would considerably increase the mass, and k can be larger too, thus resulting in more realistic LF resonators. Even accelerometers that have resonant frequencies mostly below 100 kHz are commonly made with a thickness of more than 50 nm.

An equation of movement is $m*a+b*v+k*x=F_{ext}$

Where:
m=mass,
a=$2^{nd}$ order time derivative of displacement or acceleration,
v=$1^{st}$ order time derivative of displacement or velocity,
b=damping coefficient,
k=spring constant,
x=displacement,
$F_{ext}$=external force, like electrical force from the electrodes.

The terms with mass (kinetic energy) and spring constant (potential spring energy) are easily dominated by the damping if m and k are very low. At 100 times lower frequencies, vacuum requirements can be up to 100 times higher. It is recommendable for low frequency resonators to have a 10 to 100 times larger mass as compared to their HF counterparts and therefore the device thickness should be about 10 to 100 times larger. The device itself can be chosen to be a bending/flex-mode resonator, as compared to a bulk mode (expansion-compression) type of resonator for HF.

Altogether LF and HF resonators are very hard to make with the same layer thickness. Using the techniques described herein, LF and HF resonators are combined on one chip.

The present method is also particularly suited for integration with CMOS or BiCmos. Two devices may share the same vacuum cavity, but this is not necessary.

The present LF devices are implemented in a handle wafer substrate by Deep reactive ion Etching for instance, if necessary after thinning a substrate to a required thickness of, for example, 50 µm, 100 µm, or more. Electrical contacts to a bond pad or integrated circuit could be implemented by use of front-to-back handle wafer contact holes, or other known ways. In more detail, PCT Pat. Publ. WO2004/071943 describes a construction where top contacts through an insulating layer in an SOI substrate are used to suspend a bulk MEMS device, with release from the handle wafer back to the substrate. The present invention could make use of this in the sense that in a thin SOI layer on top, another MEMS is produced, resulting in a unique monolithic structure of two MEMS with different layer thickness in two silicon layers of the SOI substrate, which can be monolithically integrated with electronics such as CMOS in the same substrate.

An application for the combination of a HF MEMS resonator monolithically integrated with a LF resonator would be a replacement of two or more timing devices such as quartz crystals or ceramic crystals.

Another application is to have two (or more) MEMS resonators packaged together with an oscillator circuit chip which would contain the oscillator circuits to keep the resonators oscillating. This is a single package multi-clock chip. For many applications, several clock signals are required, like for various clock signals that are distributed over PC motherboards, or combinations of clocks for digital signal processors with wireless or wired communication functions like WLAN with GSM, FM radio or USB. Such applications are envisaged for the front end micro cavity.

Another application is to have the oscillator circuit integrated with MEMS resonators in a same chip, for which our present technology is particularly suited, but which could as well be integrated in other processing flows. The advantage of integration would be the wafer level trimming for achieving accuracy comparable to quartz crystal oscillators (XO, 50 ppm frequency accuracy).

An advantageous combination of two MEMS devices is an XY-sensing accelerometer in a thick bulk handle wafer substrate, with a vertically sensitive accelerometer in a thin SOI layer, which is very suitable due to its thin springs. The present process flow facilitates having a vertical electrode on top of a vertical movement sensor for measurement of vertical displacement of a Z accelerometer.

In a third aspect, a device, such as band-pass filter, harmonic suppression notch, phase shifter, LC circuit, a semiconductor device, includes a micro cavity as described herein.

With the present on-chip integration there is no signal loss due to chip-to-chip connections. Hence, this results in less power consumption.

In a fourth aspect, an RF circuit includes a micro cavity as described herein.

With the present on-chip integration there is no signal loss due to chip-to-chip connections. Hence, this results in less power consumption.

The present invention is further elucidated by the following Figures and examples, which are not intended to limit the scope of the invention. A person skilled in the art will understand that various embodiments may be combined, and are envisaged by the present invention.

FIG. 1 shows a starting material being a standard thin-film SOI substrate, consisting of a mono-crystalline silicon substrate (100), a buried silicon oxide layer (BOX, typically 1 µm thick) (101) and a thin mono-crystalline silicon layer (SOI, typically 1.5 µm thick) (102). This substrate is a default for high-voltage processes such as ABCD3 and ABCD9. The SOI layer is also ideal to make good MEMS structures, such as resonators. Its material parameters are much better controlled than for instance when using poly-crystalline silicon, as is used for fabricating analog devices.

It should be noted that it is also possible to use a much thicker SOI layer (from 10-20 µm). In such a way it would be possible to use any standard CMOS process, and further ABCD-like processes. At the same time certain MEMS devices would also benefit from the increased mass that comes with a thicker layer.

FIGS. 2-4: A first step is to define the MEMS structure. This is done by depositing a photoresist layer (103), providing a mask and making an image of the mask, and etching trenches around the structure, which later on in the process will be released. Trenches (114) (FIG. 4) are etched down to the BOX, thereby completely isolating a MEMS structure (115), except for some anchor points, which are located in a 3rd dimension (not drawn). It should be noted that this etch can, in some cases, be combined with an available trench-isolation step.

FIG. 5: To enable further processing, without leaving the MEMS device released and thus very fragile, the trenches (114) are filled with silicon oxide (111), just in a similar way one would fill for instance a STI.

Figure 7A:
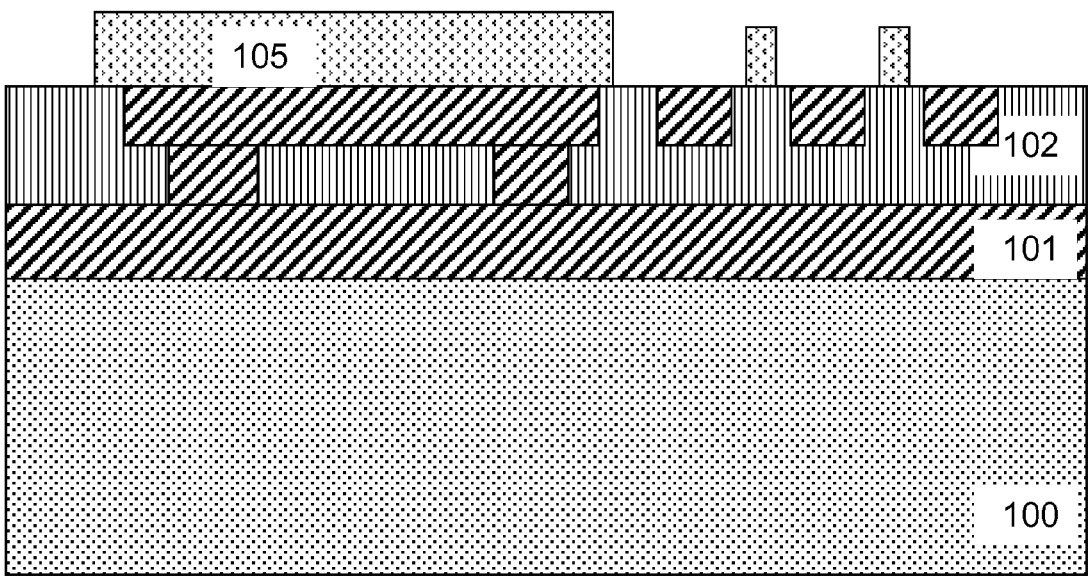
Figure 7B:
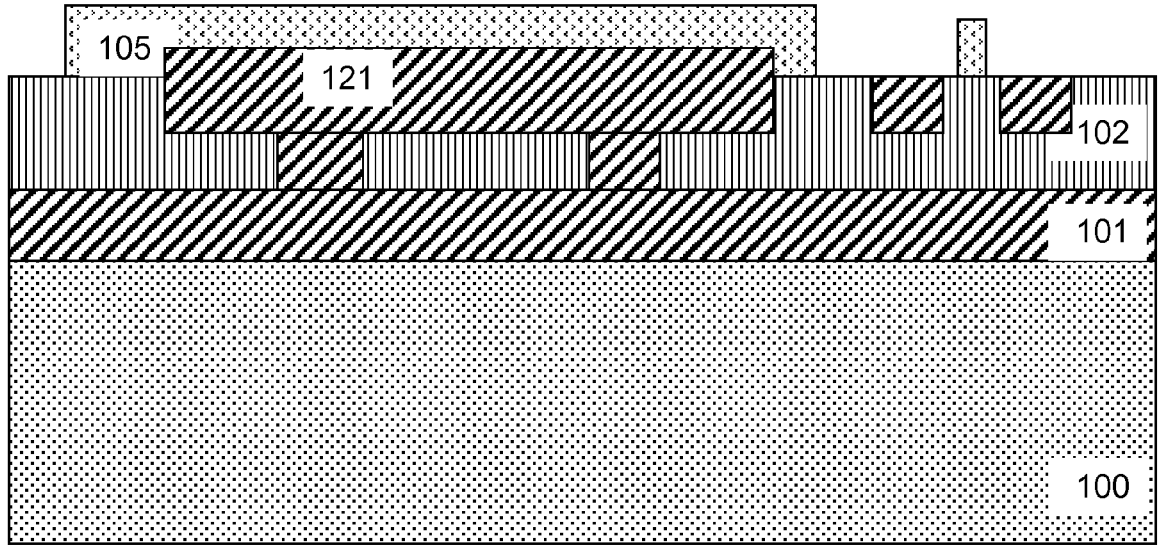

FIGS. 6, 7a: The top surface of the MEMS also needs to be separated. This is achieved by using a standard field isolation (STI or LOCOS) (121), followed by covering the entire MEMS structure with, in this example, a poly silicon layer (105) of a CMOS gate. It is noted that there typically is also gate oxide present between poly and active areas. It should be noted, further, that the overlap of the capping layer (poly silicon) beyond the oxide (STI or LOCOS) on the top edge of the MEMS structure has to be defined such that during the release etch (FIG. 11), there is some gate oxide remaining to the sides, such that the poly silicon is still fully covering the cavity surrounding the MEMS device. FIG. 7b shows an alternative, wherein a capping layer can be extended laterally, if this layer is provided on LOCOS layer (121). An advantage thereof is that in a release etch a gate-oxide need not be etched away, especially if some LOCOS remains at the etches of a cavity. As such, complications with capillary force in a gate-oxide layer are prevented.

These steps in fact already are part of the standard CMOS processing: in the same steps also the normal field isolation and gate patterning are provided.

Alternatively, one could also use the first inter-metal dielectric (IMD) layer instead of LOCOS or STI as a separation layer, and METAL1 instead of gate-poly silicon as the cap-layer, especially for a thin (1.5 µm) SOI thickness. This would result in a significantly thicker MEMS device, and possibly in more space above the MEMS device within the cavity. This may be an advantage when a cap bends through as a consequence of tension, especially at larger structures of, for example, greater than 100 µm diameter.

The remainder of the CMOS processing is summarized in FIG. 8. Therein various isolating layers (106), such as dielectric layers, are formed. Also various metal layers (107) are formed. Further, typically a final sealing layer, such as silicon nitride is formed (not shown).

FIG. 9: After the standard process has finished, the silicon substrate (100) is grinded down to a thickness on the order of 50-400 µm (this thickness depends on the minimum thickness that can still be handled mechanically). Thereafter a photoresist (108) is deposited on the silicon substrate (100) and patterned. Thereafter the resist is etched.

FIG. 10: From the backside of the substrate, trenches (124) are etched through the silicon, below the MEMS device, all the way up to the BOX-layer.

FIG. 11: The MEMS device is then released by removing the oxide thereby forming a cavity (134), e.g., by using a wet- or vapor-HF etch. Because the trenches were etched down to the BOX, filled with oxide, and covered with an oxide block, the release can be done in one etch-step. A person skilled in the art will recognize that a critical point in this step is the tuning of the exact etch-time, together with the designed overlap of the cap (see also comment with FIGS. 6 and 7).

FIG. 12: To seal the MEMS device, it is sufficient to deposit a hermetic sealing layer (190), such as a metal layer, on the backside of the wafer. Especially sputter-deposited aluminum has poor step coverage: the holes will be closed from the top, without any significant deposition inside the trench. The vacuum level inside the cavity, after sealing, will be approximately the pressure during sputter-deposition of the aluminum, since the entire cavity is enclosed by layers that have all seen front-end processing temperature steps (typically >1000° C.), which means there is very little out-gassing to be expected.

FIG. 13 shows release of a first and second MEMS device. Therein two cavities are formed, one thick and one thin. Such cavities may have different functions. For example, one MEMS may be used for a clock, whereas the second MEMS may be used as a switch.

FIG. 14 shows sealing of a first and second MEMS device. Layer (109a) may need to be formed by a capping wafer, as is indicated by the small bridge like structure therein.

What is claimed is:

1. A method of forming one or more micro cavities, each micro cavity comprising a micro electrical mechanical system (MEMS), in a process further forming at least one semiconductor component in parallel with the micro cavity and having process steps in common, comprising:
   releasing the micro cavity after the formation of the at least one semiconductor component is finished;
   providing a plurality of release openings through a backside of a substrate at the micro cavity, wherein a total area of the release openings through the backside of the substrate at the micro cavity is about 50% or less of the corresponding area of the micro cavity, and a density of the release openings is about 0.25 or less per µm²; and
   depositing a hermetic sealing layer on the backside of the substrate to seal the micro cavity formed by etching, wherein at least part of the hermetic sealing layer is deposited by sputtering metal on the backside of the substrate, wherein the hermetic sealing layer is in physical contact with the entire backside of the substrate, and wherein sidewalls of the openings are essentially free of the hermetic sealing layer.

2. The method according to claim 1, wherein two or more micro cavities are formed, comprising at least one first cavity being a thick cavity, and at least one second cavity being a thin cavity.

3. The method according to claim 1, comprising:
   providing the at least one semiconductor component on a front side of the substrate,
   wherein the plurality of release openings through said backside of the substrate are selected from the group consisting of trenches, vias, holes, and combinations thereof,
   etching through the plurality of release openings, thereby releasing the micro cavity.

4. The method according to claim 3, wherein the total area of the one or more release openings is from 10%-25% of the total surface area of the corresponding micro cavity, and the density of the release openings is about 0.05-0.1 per µ² at the backside of the substrate.

5. The method according to claim 3, wherein the one or more release openings have a width of 0.6 µm and a length of 0.6 µm.

6. The method according to claim 1, wherein the micro cavity comprises a MEMS, and wherein the micro cavity prior to etching comprises a dielectric material, further comprising:
   depositing a dielectric layer on the front side of the substrate,
   depositing a silicon layer on said dielectric layer,
   forming a second set of one or more release openings in said silicon layer, selected from the group consisting of trenches, vias, holes, and combinations thereof,
   forming a dielectric structure in said silicon layer by filling the second set of one or more release openings with a dielectric material,
   etching the plurality of release openings through the backside of the substrate, below the MEMS device, all the way up and through to the dielectric layer, removing the dielectric material in the second set of one or more release openings in said silicon layer, and removing the dielectric structure in said silicon layer, thereby releasing the MEMS.

7. The method according to claim 6, wherein, before etching, the backside of the substrate is grinded down to a predetermined thickness at the backside of 50-400 µm.

8. The method according to claim 1, further comprising:
   wherein a starting material is a standard thin-film SOI substrate, consisting of a mono-crystalline silicon substrate, a buried silicon oxide layer (BOX) and a thin mono-crystalline silicon layer,
   defining the micro cavity comprising a MEMS structure by forming a second set of one or more release openings in said silicon layer, and by forming a dielectric structure in said silicon layer by etching and filling the etched portions that later on in the process will be released, wherein one or more release openings in said silicon layer are etched down to the BOX, thereby completely isolating the MEMS structure, except for at least one anchor point, filling the one or more release openings with silicon oxide, separating a top surface of the MEMS, followed by covering the entire MEMS structure with a poly silicon layer of a CMOS gate, wherein an overlap of a capping layer of poly silicon and oxide beyond an edge of the MEMS structure is defined, and wherein normal field isolation and gate patterning are provided, such that during a subsequent release etch there is some oxide remaining to the sides.

9. The method according to claim 1, further comprising forming a separation layer,
wherein a first inter-metal dielectric (IMD) layer or LOCOS or STI is used as the separation layer, and/or wherein METAL1 or gate-poly silicon is used as a cap-layer.

10. The method according to claim 1, further comprising providing a passivation layer.

11. The method according to claim 1, wherein the hermetic sealing layer comprises aluminum metal.

12. An apparatus comprising:
a semiconductor component on a first side of a substrate, the semiconductor component comprising a micro cavity comprising a MEMS structure, the micro cavity comprising release openings through the substrate on which said micro cavity is formed, wherein a total area of the release openings through the substrate at the micro cavity is about 50% or less of the corresponding area of the micro cavity, and a density of the release openings is about 0.25 or less per $\mu m^2$; and
a metal hermetic sealing layer on a second side of said substrate, wherein the hermetic sealing layer is deposited by sputtering aluminum metal on the second side of the substrate, wherein the hermetic sealing layer is in physical contact with the entire second side of the substrate, and wherein sidewalls of the openings are essentially free of the hermetic sealing layer.

13. An apparatus according to claim 12, wherein the semiconductor component comprises a band-pass filter.

14. An apparatus according to claim 12, wherein the semiconductor component comprises an RF circuit.

15. An apparatus according to claim 12, wherein the semiconductor component comprises a harmonic suppression notch.

16. An apparatus according to claim 12, wherein the semiconductor component comprises a phase shifter.

17. An apparatus according to claim 12, wherein the semiconductor component comprises an LC circuit.

18. An integrated device comprising:
a substrate;
multiple micro cavities on the substrate, each micro cavity comprising a micro electrical mechanical system (MEMS), wherein at least a first micro cavity is a thick micro cavity and at least a second micro cavity is a thin micro cavity;
a plurality of release openings through a backside of the substrate at the micro cavity, wherein a total area of the release openings through the backside of the substrate at each micro cavity is about 50% or less of the area of the corresponding micro cavity, and a density of the release openings is about 0.25 or less per $\mu m^2$; and
a metal hermetic sealing layer to seal the multiple micro cavities on the substrate, wherein the metal hermetic sealing layer is formed by sputtering aluminum metal on the backside of the substrate, wherein the hermetic sealing layer is in physical contact with the entire backside of the substrate, and wherein sidewalls of the openings are essentially free of the hermetic sealing layer.

19. The integrated device according to claim 18, wherein a MEMS device in the thick micro cavity is capable of operating at low frequency and a MEMS device in the thin micro cavity is capable of operating at high frequency.

* * * * *